(12) United States Patent
Jeng

(10) Patent No.: US 6,903,968 B2
(45) Date of Patent: Jun. 7, 2005

(54) NONVOLATILE MEMORY CAPABLE OF STORING MULTIBITS BINARY INFORMATION AND THE METHOD OF FORMING THE SAME

(75) Inventor: Erik S. Jeng, Taipei (TW)

(73) Assignee: Applied Intellectual Properties Co., Ltd., Taipei (TW)

( * ) Notice: Subject to any disclaimer, the term of this patent is extended or adjusted under 35 U.S.C. 154(b) by 0 days.

(21) Appl. No.: 10/763,773

(22) Filed: Jan. 22, 2004

(65) Prior Publication Data

US 2004/0151021 A1 Aug. 5, 2004

Related U.S. Application Data

(62) Division of application No. 10/338,108, filed on Jan. 6, 2003, now Pat. No. 6,740,927.

(51) Int. Cl.⁷ .............................................. G11C 16/04
(52) U.S. Cl. ............................ 365/185.03; 365/185.28; 365/185.29
(58) Field of Search ................... 365/185.03, 185.18, 365/185.28, 185.29, 185.33, 185.01

(56) References Cited

U.S. PATENT DOCUMENTS

| 6,144,062 | A | | 11/2000 | Mine |
| 6,329,687 | B1 | | 12/2001 | Sobek |
| 6,596,590 | B1 | * | 7/2003 | Miura et al. ................. 438/261 |
| 6,714,454 | B2 | * | 3/2004 | Ma et al. ................ 365/185.18 |
| 6,734,055 | B1 | * | 5/2004 | Lin et al. ..................... 438/201 |
| 6,774,432 | B1 | * | 8/2004 | Ngo et al. ................... 257/325 |
| 6,777,757 | B2 | * | 8/2004 | Peng et al. ................. 257/368 |
| 2003/0067030 | A1 | | 4/2003 | Torii |
| 2003/0178671 | A1 | | 9/2003 | Takahashi |
| 2003/0208663 | A1 | * | 11/2003 | Van Buskirk et al. ...... 711/156 |
| 2004/0004863 | A1 | | 1/2004 | Wang |

* cited by examiner

Primary Examiner—Gene N. Auduong
(74) Attorney, Agent, or Firm—Perkins Coie LLP

(57) ABSTRACT

A nonvolatile memory capable of storing multi-bits binary information is provided. The memory includes an oxide formed on a substrate. A control gate is formed on the oxide. An L-shape structure is attached on sidewall of the control gate. Spacers are formed on the L-shape structure to act as a floating gate. A first doped region and a second doped region is formed in the substrate adjacent to the spacers with a channel between the two doped regions. Wherein the spacer represent a first binary status by injecting and storing electrical charges in the spacers. Or to represent a second binary status by not injecting electrical charges into the spacer.

9 Claims, 7 Drawing Sheets

NONVOLATILE MEMORY CAPABLE OF STORING MULTIBITS BINARY INFORMATION AND THE METHOD OF FORMING THE SAME

CROSS REFERENCE TO RELATED APPLICATIONS

This application is a divisional of U.S. patent application Ser. No. 10/338,108, filed Jan. 6, 2003 now U.S. Pat. No. 6,740,927, which is hereby incorporated by reference in its entirety.

The present invention relates to a semiconductor device, and more specifically, to a method of fabricating nonvolatile memory capable of storing multi-bits binary information and the novel device structure.

BACKGROUND OF THE INVENTION

The semiconductor industry has been advanced to the field of Ultra Large Scale Integrated Circuit (ULSI) technologies. The fabrication of the nonvolatile memories also follows the trend of the reduction in the size of a device. The nonvolatile memories include various types of devices. Different types of devices have been developed for specific applications' requirements in each of these segments. Flash memory is one of the segments of nonvolatile memory devices. The device includes a floating gate to storage charges and an element for electrically placing charge in and removing the charges from the floating gate. One of the applications of flash memory is BIOS for computers. Typically, the high-density nonvolatile memories can be applied as the mass storage of portable handy terminals, solid-state camera and PC cards. It is because that the nonvolatile memories exhibit many advantages, such as memory retention without power, fast access time, low power dissipation in operation, and robustness.

The formation of nonvolatile memories toward the trends of low supply power and fast access, because these requirements are necessary for the application of the mobile computing system. Flash memory needs the charges to be hold in the floating gate for a long period of time. Therefore, the dielectric that is used for insulating the floating gate needs to be high quality in insulation and good durability in writing. At present, the low voltage flash memory is applied with a voltage of about 5V to 10V during charging or discharging the floating gate. As known in the art, the tunneling effect is a basic technology in charging or discharging. In order to attain high tunneling efficiency, the thickness of the dielectric between the floating gate and substrate have to be scaled down due to the supply voltage is reduced. The data program method of a non-volatile memory device includes a method using Fowler-Nordheim (FN) tunneling or a method using hot electron injection. In FN tunneling, a high voltage is applied to a control gate to induce a high electric field in a tunnel oxide layer, and electrons of a semiconductor substrate pass the tunnel oxide layer and are injected into a floating gate. During the mode of erasing, the bias may apply on the source to discharge the electron from the floating gate to the source of a memory device.

Conventional memory cell consists of a source region, a drain region, a floating gate (FG), a control gate (CG) and insulation films. A plurality of sectors are arranged in the two-dimensional manner on a semiconductor substrate of the flash memory. Memory cells are separated from one another by an element isolation region of LOCOS (local oxidization of silicon) or STI (shallow trench isolation). When writing a new data or rewriting a data stored in the flash memory, the stored data in memory cells are erased on the sector basis immediately before the writing. The device is called flash due to the data is erased sector by sector.

The prior art single bit charge trapping dielectric flash EEPROM memory cells are constructed with a charge trapping ONO layer. The memory cell generally includes a P-type silicon substrate and two PN junctions between N+ source and drain regions and P type substrate, a nitride layer sandwiched between two oxide layers and a polycrystalline layer. To program or write the cell, voltages are applied to the drain and the gate and the source is grounded. These voltages generate a vertical and lateral electric field along the length of the channel from the source to the drain. This electric field causes electrons to be drawn off the source and begin accelerating towards the drain. The hot electrons are generated at the boundary between drain and channel during the acceleration. These hot electrons are then redirected vertically into the ONO layer. Two of the ONO memories capable for storing two bits binary can refer to U.S. Pat. No. 6,011,725 to Boaz and U.S. Pat. No. 6,335,554 to Yoshikawa.

To further understand the role of "floating gate", please refer to FIG. 1A, it illustrates the well-known programming of the flash device. During the mode of programming, positive bias is applied on the control gate 105 for tunneling the carriers through the oxide 102 from the source 101a of the substrate 101 to the floating gate 103. In the erasing mode, negative bias, for example, is introduced on the control gate 105 while positive bias is applied on the drain 101b to force the electron out of the floating gate to the source, as shown in FIG. 1b.

In the prior art, a set of data can be programmed or erased at one time. The number of the memory units in the flash memory means the number of cells that can be programmed or erased. If there exist two sectors to store the data in a single cell, respectively, the device may program or erase two sets of data. Therefore, the capacity of the data set that is programmed or erased by this flash device is twice of the number of the traditional memory units in the flash memory.

SUMMARY OF THE INVENTION

The object of the present invention is to disclose a flash device with multi-bits cell capable of storing multi binary information bits. The further object of the present invention is to provide the method of forming the memory.

A method for manufacturing a nonvolatile memory capable of storing multi-bits binary information is disclosed. The method comprises the steps of forming an oxide on the semiconductor substrate. A conductive layer is formed on the oxide layer. A conductive layer is patterned to form a gate structure to act as a control gate. A first isolation layer is formed over the gate structure. A second isolation layer is formed over the first isolation layer. Then, performing an etching to etch the first isolation layer and the second isolation layer, thereby forming a L-shape structure attached on sidewall of the gate structure and a spacer on the L-shape structure, wherein the spacer functions as floating gate. Subsequently, an ion implantation is performed using the gate structure and the spacer as a mask to form source and drain regions in the semiconductor substrate adjacent to the spacer, wherein a channel under the gate structure keeps a distance from the source and drain regions. This distance connected between channel and drain region (or source region) is known as "fringing field induced channel" which is to be turned on by the gate voltage induced electric fringing field.

A silicide material is further formed on the gate structure and the source and drain regions. The silicide material includes $TiSi_2$, $CoSi_2$ or NiSi. Wherein the spacer is formed by an anisotropical etching and the first isolation layer includes $SiO_2$ or $HfO_2$. The second isolation layer includes nitride.

A nonvolatile memory capable of storing multi-bits binary information bits is provided. The memory includes an oxide formed on a substrate. A control gate is formed on the oxide. A L-shape structure is attached on sidewall of the control gate. Spacers are formed on the L-shape structure to act as a floating gate. A first doped region and a second doped region is formed in the substrate adjacent to the spacers. Wherein the spacers represent a first binary status by injecting and storing electrical charge in the spacers or to represent a second binary status by not injecting electrical charge into the spacer. A first and a second fringing field induced channels are under the first and the second spacers, wherein the first and the second fringing field induced channels are located between the main gate-induced channel. The first and the second doped regions sit adjacent to the first and the second fringing field induced channels, respectively. The main gate-induced channel is referred to the channel generated under the gate by conventional fashion. The fringing field induced channels are referred to the hot carrier injection channel under the spacers.

Method of Programming

In the scheme according to the present invention called "Forward Program and Reverse Read", a high voltage is performed to program at one doped region side where charges are stored in the same side of spacer. Another high voltage is performed at the reverse side of doped region to read these charges. Furthermore, depending upon the geometry of the gate, the cell includes at least four sidewall spacers around a square gate structure. Under such arrangement, the present invention is capable of storing 4-bits information rather than two bits. A method of programming a nonvolatile memory capable of storing multi-bits binary information is disclosed. The memory cell includes a plurality of doped regions with a channel there between. It also includes a gate above the channel, a L-shape dielectric layer is formed on side wall of the gate. The spacers is attached on the L-shape dielectric layer, the method comprising: programming a first bit by applying programming voltages to the first doped region and to the gate and applying programming current or ground potential on the second doped region, thereby injecting and storing electrical charge in a first spacer close to the first doped region to represent the first binary status, or to represent a second binary status by not injecting electrical charge into the first spacer; programming a second bit by applying programming voltages to the second doped region, to the gate and applying the first doped region with programming current or ground potential, thereby injecting and storing electrical charge in a second spacer close to the second doped region, or by not injecting electrical charge into the second spacer; programming a third bit by applying programming voltages to the third doped region of the plurality of doped regions and to the gate while applying the fourth doped region with programming current or ground potential, thereby injecting and storing electrical charge in a third spacer adjacent to the third doped region, or by not injecting electrical charge into the third spacer.

The programming may further comprises programming a fourth bit by applying programming voltages to the fourth doped region and applying the same bias to the gate while applying the third doped region with programming current or ground potential, thereby injecting and storing electrical charge in a fourth spacer adjacent to the fourth doped region, or by not injecting electrical charge into the fourth spacer.

Method of Erasing

A method of programming a nonvolatile memory capable of storing multi-bits binary information bits, the memory cell having a first doped region and a second doped region with a channel therebetween and having a gate above the channel, a L-shape dielectric layer formed on side wall of the gate, spacers attached on the L-shape dielectric layer, the method comprising: erasing a first bit of the two binary information bits by applying erasing voltages to the gate and a first doped region such that to cause charge representing a first binary status to be removed from a first spacer of the spacers for charge trapping; erasing a second bit of the two binary information bits by applying erasing voltages to the gate and a second doped region such that to cause charge representing a second binary status to be removed from a second spacer of the spacers for charge trapping.

Method of Reading

A method of reading an nonvolatile memory capable of storing multi-bits binary information bits, the memory cell having a first doped region and a second doped region with a channel therebetween and having a gate above the channel, a L-shape dielectric layer formed on side wall of the gate, spacers attached on the L-shape dielectric layer, the method comprising: applying a reading bias on the gate and a second doped region, the reading bias having levels lower than the voltages applied during programming for sensing a channel current to determine whether the channel current is significant representing a first binary status in the spacer adjacent to the first doped region or the channel current is relative low to the significant channel current representing a second binary status in the spacer adjacent to the first doped region; applying the reading bias on the gate and a first doped region, the reading bias having levels lower than the voltages applied during programming for sensing the channel current to determine whether the channel current is significant representing the first binary status in the spacer adjacent to the second doped region or the channel current is relative low to the significant channel current repressing the second binary status in the spacer adjacent to the second doped region.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1A:
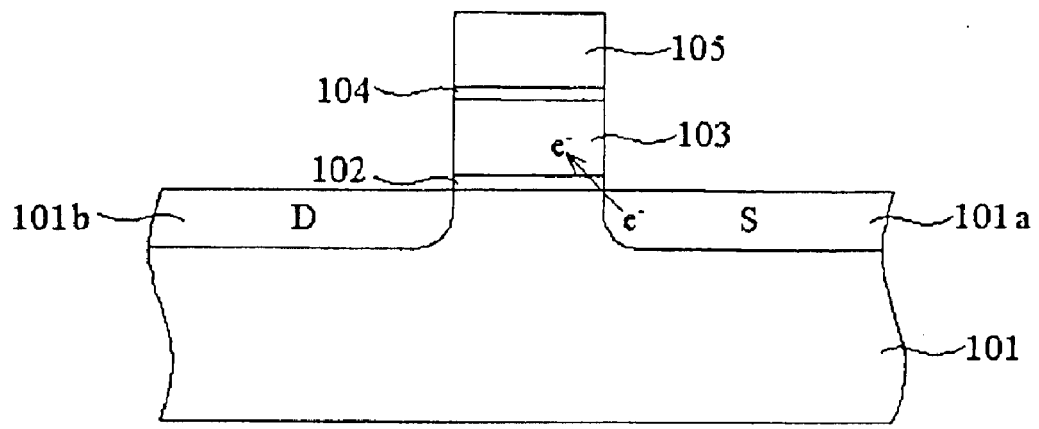
FIG. 1A is a cross sectional view of a semiconductor wafer illustrating the programming mode of memory according to the prior art.
Figure 1B:
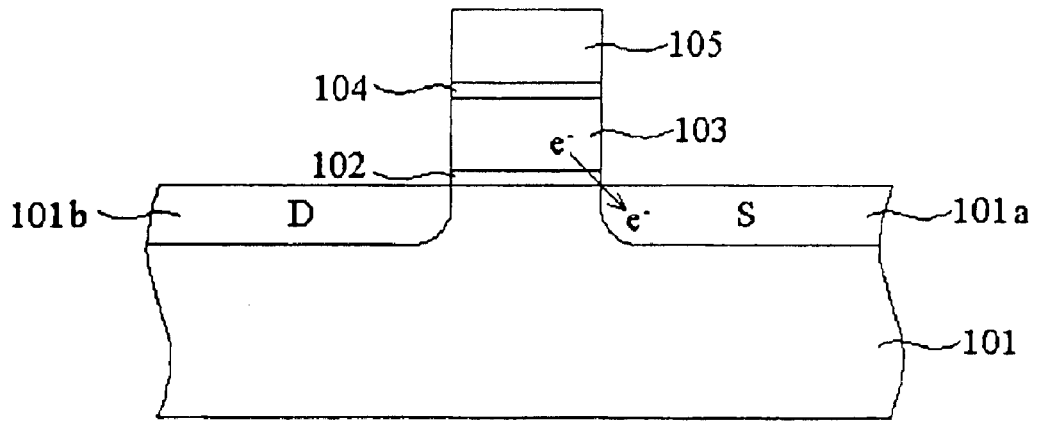
FIG. 1B is a cross sectional view of a semiconductor wafer illustrating the erasing mode of memory according to the prior art.
Figure 2A:
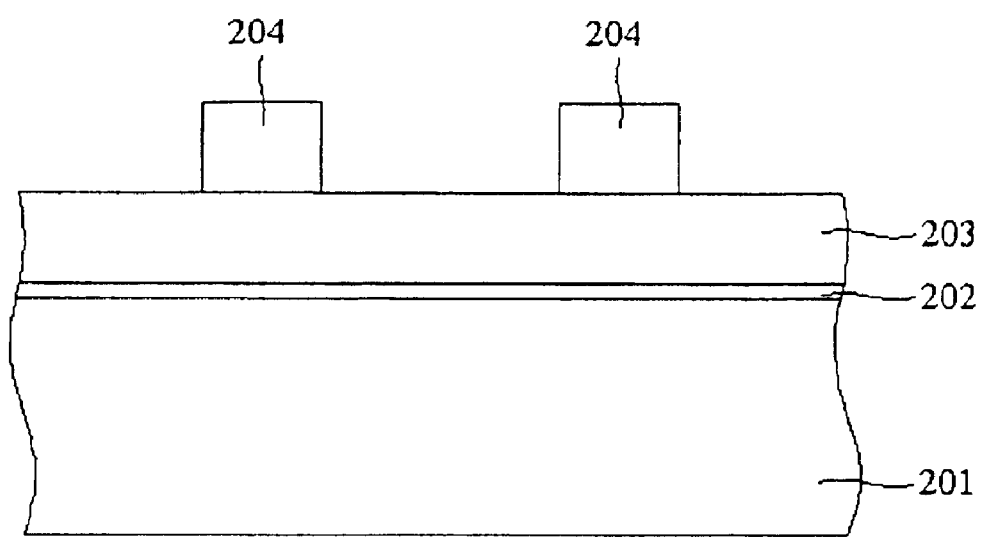
FIGS. 2A–2H are cross sectional views of a semiconductor wafer illustrating the steps of forming the memory according to the present invention.
Figure 2B:
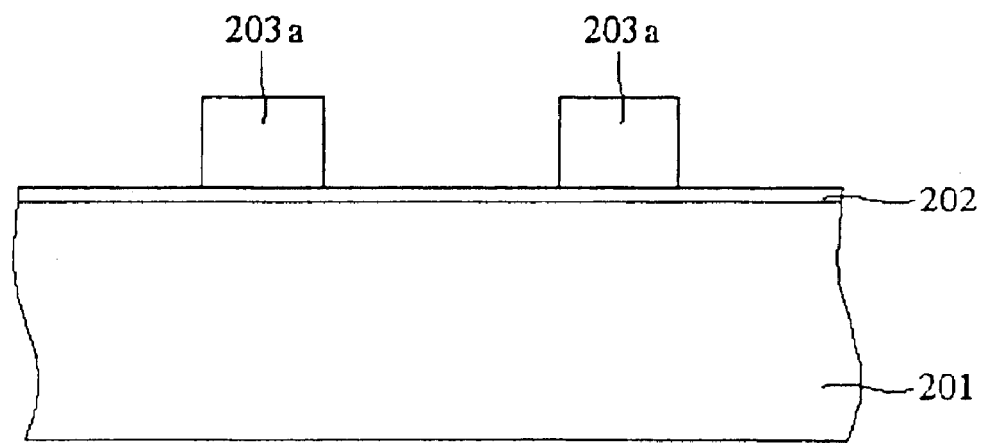
Figure 2C:
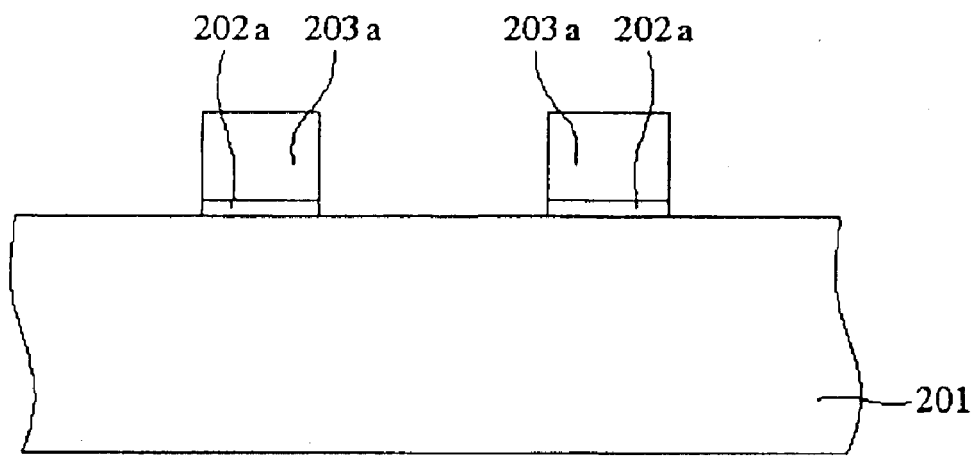

The present invention proposes a novel method to fabricate a flash nonvolatile memory. In the method, the cell capacity for storing data can be increased by the cell structure. The detail description will be seen as follows. A semiconductor substrate is provided for the present invention. In a preferred embodiment, as shown in the FIG. 2A, a single crystal silicon substrate 201 with a <100> or <111> crystallographic orientation is provided. The substrate 201 includes a pattern of active areas comprising separated doped region such as the source/drain regions. A thin dielectric layer 202 consisted of silicon dioxide is formed on the substrate 201 to act as gate oxide. Typically, the oxide 202 can be grown in oxygen ambient at a temperature of about 700 to 1100 degrees centigrade. Other method, such as chemical vapor deposition, can also form the oxide. In the embodiment, the thickness of the silicon dioxide layer 202 is approximately 50–500 angstroms. Subsequently, a conductive layer 203 is formed on the oxide 202. The conductive layer 203 may be formed of doped polysilicon, in-situ doped polysilicon or epitaxy silicon. For an embodiment, the doped polysilicon layer 20 is doped by phosphorus using a $PH_3$ source. A photo-resist pattern 204 is formed on the conductive layer 203 followed by etching the conductive layer 203 by using the photo-resist pattern 204 as etching mask, thereby forming the gate structure 203a on the silicon substrate 201. Then, the silicon substrate 201 is removed by conventional manner, as shown in FIG. 2B. The gate oxide 202 exposed by the gate structure 203a is removed in FIG. 2C, it can also be removed during the etching for forming the gate structure 203a. The residual gate oxide 202a is under the gate structure 203a.

Figure 2D:
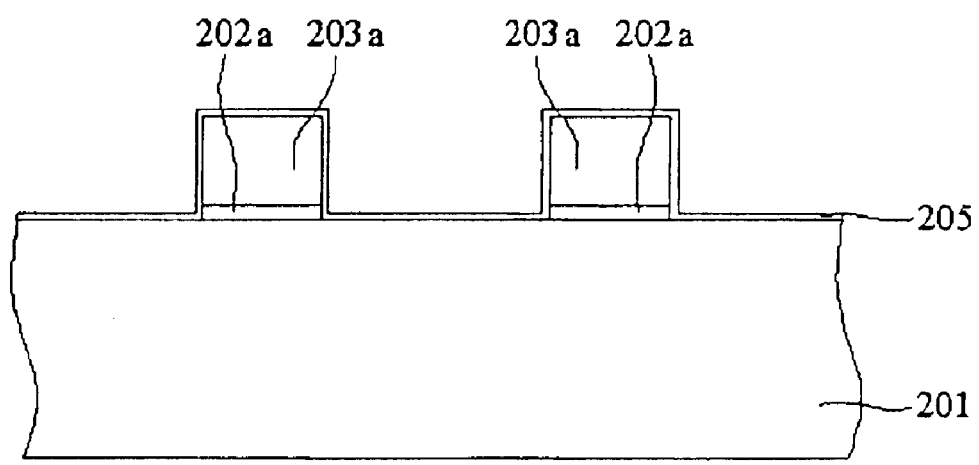

Please refer to FIG. 2D, an isolation layer 205 is conformally formed on the substrate 201 and the gate structure 203a. The material for forming the isolation layer 205 can be oxide ($SiO_2$) or ($HfO_2$). One suitable method for the oxide layer 205 includes thermal oxidation and deposition by CVD. For example, Low Pressure Chemical Vapor Deposition (LPCVD), Plasma Enhance Chemical Vapor Deposition (PECVD), High Density Plasma Chemical Vapor Deposition (HDPCVD).

Figure 2E:
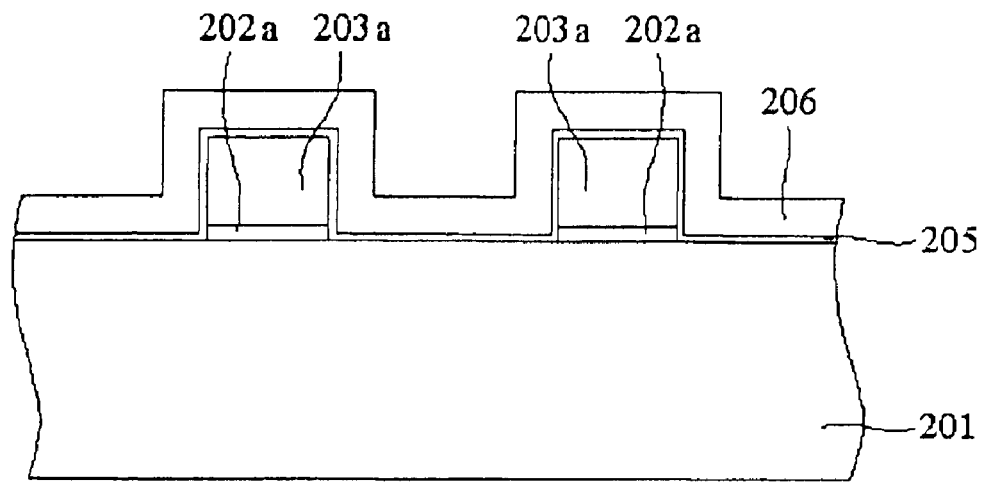

A further isolation layer 206 is next formed on the isolation layer 205 as shown in FIG. 2E. Silicon nitride may be used to act the isolation layer 206. In the preferred embodiment, the reaction gases of the step to form silicon nitride layer include, for example, $SiH_4$, NH3, $N_2$ or $SiH_2Cl_2$, $NH_3$, $N_2$.

Figure 2F:
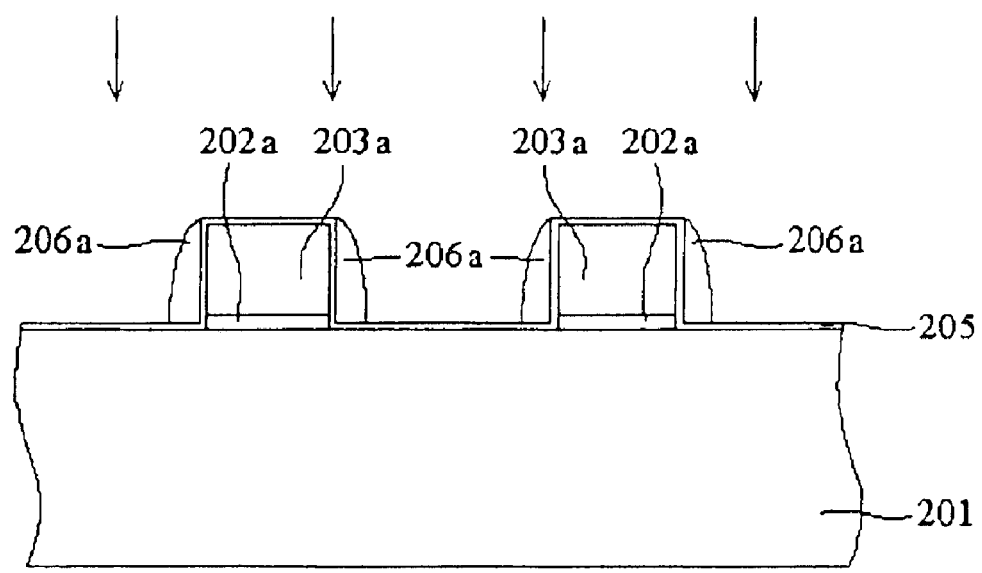

Next, still referring to FIG. 2F, an isotropically etching is performed to create sidewall spacers 206a on the sidewall of the gate structure 203a. Reactive ion etching (RIE) or plasma etching is the typical way to achieve the purpose. L-shape structure 205a is formed on the sidewall of the gate structure 203a after the formation of sidewall spacers 206a.

Figure 2G:
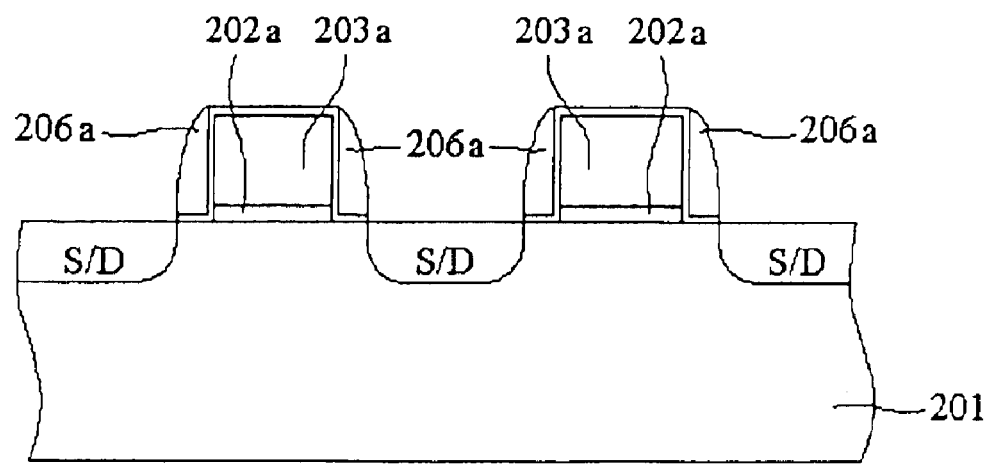

Turning to FIG. 2G, the source and drain is formed by performing an ion implantation to dope ions into the substrate 201 using the gate structure 203a and sidewall spacers 206a as a mask.

Figure 2H:
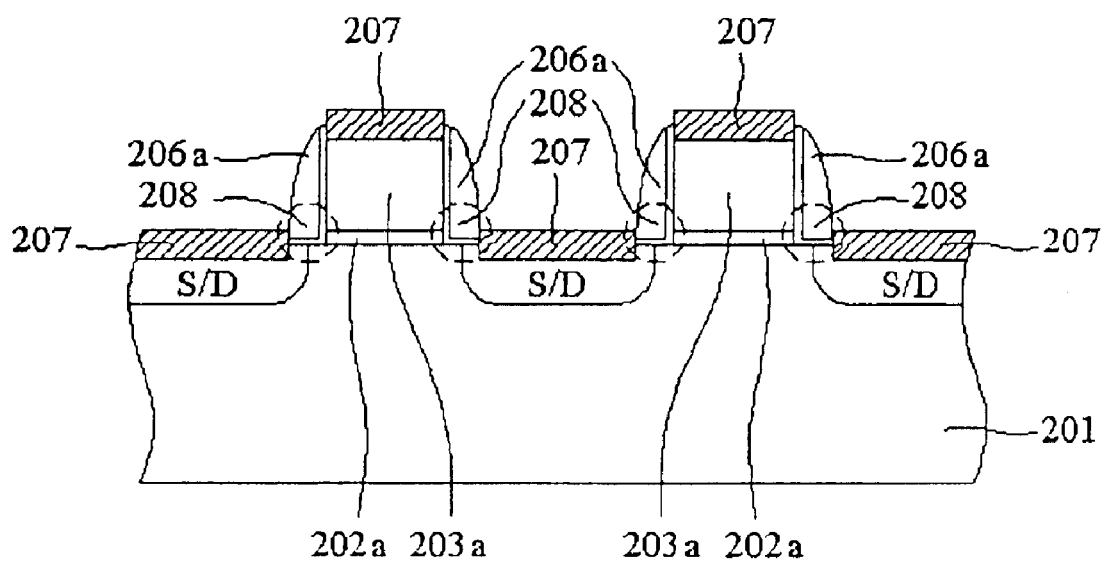

Please turning to FIG. 2H, a typical silicide process is introduced on the exposed surface of the silicon substrate 201 on the source and drain regions to reduce the resistance. Preferably, the silicide 207 can be $TiSi_2$, $CoSi_2$ or NiSi. The gate structure 203a is used as the control gate and the nitride spacers 206a acting as floating gate.

Figure 3A:
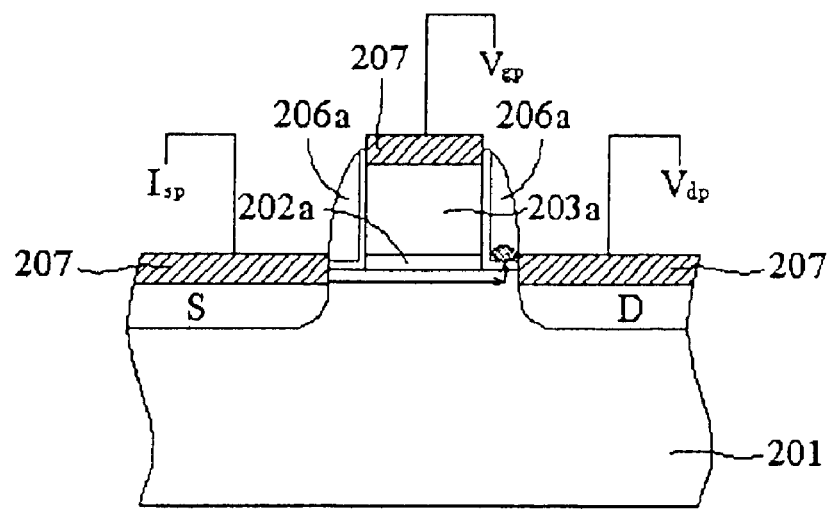
FIGS. 3A–3B is cross sectional views of a semiconductor wafer illustrating the programming mode according to the present invention.

A sectional view of a two-bit nonvolatile memory cell in accordance with the present invention is shown in FIG. 3A. The memory cell includes a substrate 201 having two buried PN junctions, one is the left junction and the other is the right junction. Channels are located between the two junctions during operation. Above the main channel is an oxide 202a. On top of the oxide layer 202a is a control gate 203a. L-shape structure 205a is formed on the sidewall of the gate structure 203a. The vertical portion of the L-shape structure 205a is attached on the side wall of the gate, and the lateral portion where tunneling will be occurred is formed on the substrate. Spacer 206a is used for charge trapping and is preferably comprised of silicon nitride. The hot electrons are trapped as they are injected into the Spacer 206a.

The memory cell is capable of storing two bits of data, a right bit and a left bit. The two bit memory cell is a symmetrical device. The left junction serves as the source terminal and the right junction serves as the drain terminal for the right bit programming. Similarly, for the left bit programming, the right junction serves as the source terminal and the left junction serves as the drain terminal. When the distinction between left and right bits is not crucial to the particular discussion, the terms source and drain are utilized as conventional manner.

Figure 3B:
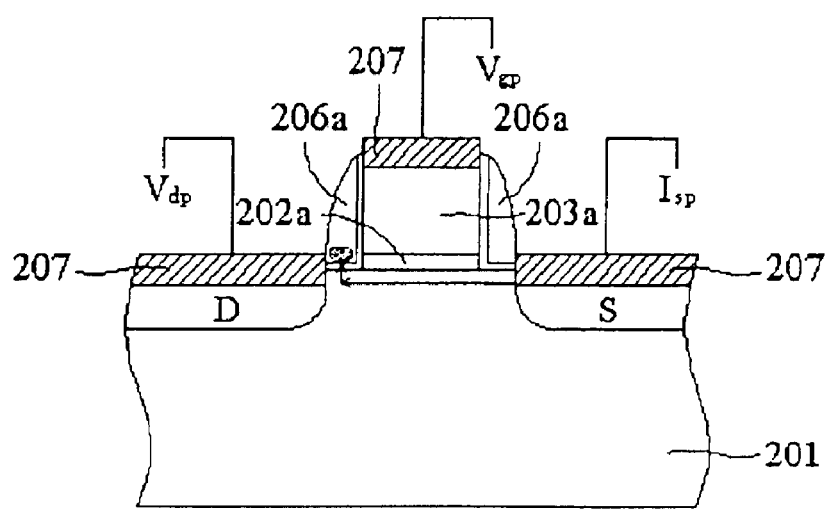

FIGS. 3A–3B illustrate the operating mode of the present invention. For the right bit, turning to FIG. 3A, a bias Vgp ranging from 1 to 10 volts is applied on the silicide 207 over the gate structure 203a for writing, while 1 to 10 volts bias Vdp is also introduced on the silicide over the drain region. The source node has 1 nA–1 mA current Isp. Channel hot carrier current is generated in the substrate 201 under the spacer 206a between the gate structure 203a and the drain. The channel hot carrier current will injects into the spacer 206a via the lateral portion of the L-shape structure adjacent to the drain side due to the source, drain keep a distance from the channel under the gate 203a. For the right bit, for example, the electron trapping occurs in a spacer region near the drain. Electrons are trapped in the portion of nitride spacer 203a near but above and self-aligned with the drain region because the strongest electric field forms there. The threshold voltage of the cell device whose fringing induced channel under the influence of trapped charge increases as additional electrons are injected into the nitride spacer 203a near the drain side. The carriers are therefore stored in the nitride spacer 206a that functions as the floating gate of the nonvolatile memory. The nitride spacer 206a on the drain side is defined as "digital one", while the spacer 206a without carrier therein on the drain side is referred to "digital zero". Hence, a set of memory unit "XY" is written as "X1" or "X0".

It should be understood that the source and drain terminals for the second bit are reversed compared to the source and drain terminals for the first bit. In programming, each bit, i.e., the left or the right bit is treated as if the device is a single bit device. Referring to FIG. 3B, for the left bit, similarly, when "1Y" is desired to be written into the cells, a bias Vgp ranging from 1 to 10 volts is applied on the silicide 207 over the gate structure 203a for writing, while 1 to 10 volts bias Vdp is also introduced on the silicide over the drain region. The source node has 1 nA–1 mA current Isp. Channel hot carrier current is generated in the substrate 201 under the spacer 206a between the gate structure 203a and the drain. The channel hot carrier current will injects into the spacer 206a adjacent to the drain side.

Therefore, the data status can be programmed or defined as "00", "01", "10" or "11" by applying the drain-write voltage Vdp and source current Isp depending on the right bit cell or left bit cell. If the two-bits are desired to be programmed as "11", the drain-write voltage Vdp and source current Isp are introduced on the left bit and right bit, respectively. The cell is operated based upon "forward program and reverse read" scheme. The read current in the channel is reverse compared to the one of programming. The cell shows totally different channel sections, source/drain and SiN spacer arrangement. One of the key features is that the source/drain regions keep a distance to the channel under the gate. In the scheme of "Forward Program and Reverse Read", there are a high voltage Program at one doped region side where charge stored and a high voltage Read at the other doped region side. From the square shape of the gate, the cell includes at least four sidewall spacers around the square gate structure. Under such arrangement, the present invention is capable of storing 4-bits information rather than two bits.

During reading, voltages having levels lower than the voltages applied during programming are applied to the gate and drain. The channel current is sensed to determine whether the channel current is very low or significant. As known, when there is significant channel current generated, it stands for binary one. If the channel current is relative low to the significant channel current, it represents binary zero.

Figure 3C:
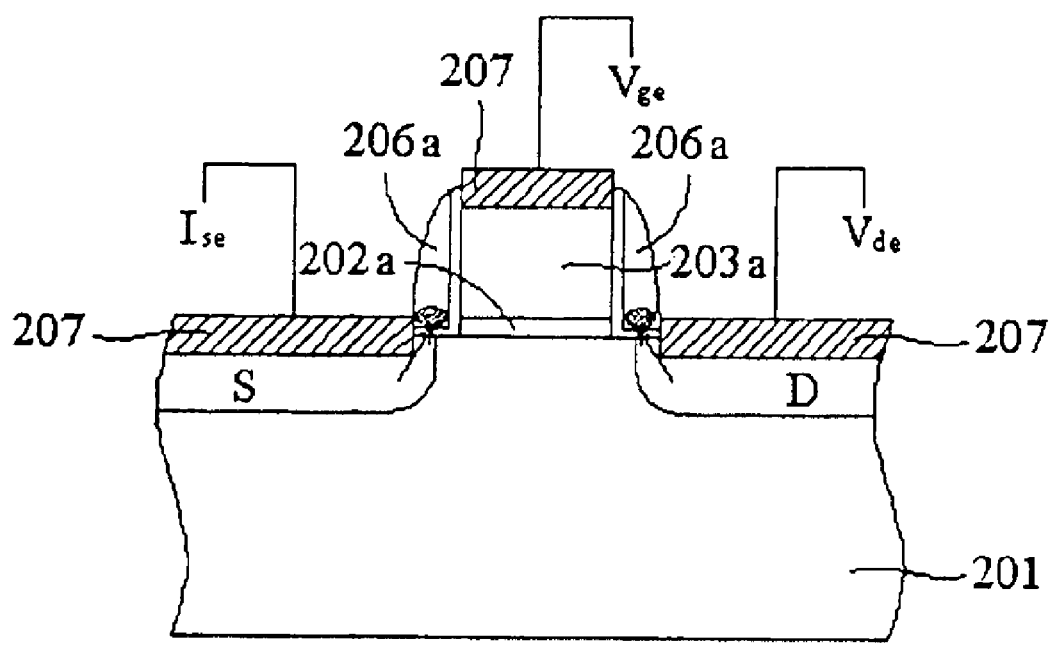
FIG. 3C is a cross sectional view of a semiconductor wafer illustrating the step of erasing mode of memory according to the present invention.

Turning to FIG. 3C, it shows a cross sectional view illustrating the erasing mode according to the present invention. A negative 10 to ground erasing voltage is applied on the gate 203a, while 1 nA to 1 mA current Ide or 1 to 10 Volts bias Vde is on the drain and the source is applied to have 1 nA to 1 mA current Ise or 1 to 10 Volts bias Vse. An opposite type of carriers will be injected into the spacers on drain side with initial carriers, thereby neutralizing the initial carrier.

For the right bit, an erase is performed by removing electrons from the charge trapping nitride spacer either through the gate 203a via the vertical portion of the L-shape oxide or through the drain via the lateral portion of the L-shape oxide. The erasing of the left bit is similar to the right bit. Alternatively, using the right bit as an example, one technique of erasing is to apply a negative potential to the gate 206a and a positive potential to the drain, simultaneously, such that electron tunneling occurs from the charge trapping spacer to the drain. The present invention may be used for EPROMs that are electrically programmed, but for erasing, EPROMs require exposure to ultraviolet (UV) light. These devices are constructed with windows transparent to UV light to allow the die to be exposed for erasing. The erasing mode includes erasing the binary state by removing charge from the first spacer by exposing the device in UV environment; and erasing the binary state by removing charge from the second spacer by exposing the device in UV environment.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A method of programming a nonvolatile memory capable of storing multi-bits binary information bits, said memory cell having a plurality of doped regions with a channel and having a gate above said channel, a L-shape dielectric layer formed on side wall of said gate, spacers attached on said L-shape dielectric layer, said method comprising:

programming a first bit by applying programming voltages to a first doped region of said plurality of doped regions and to said gate while applying programming current or ground potential on a second doped region of plurality of doped regions, thereby injecting and storing electrical charge in a first spacer of said spacers adjacent to said first doped region to represent a first binary status, or to represent a second binary status by not injecting electrical charge into said first spacer.

2. The method of claim 1, further comprising:

programming a second bit by applying programming voltages to a second doped region of a plurality of doped regions and to said gate, applying said first doped region with programming current or ground potential, thereby injecting and storing electrical charge in a second spacer of said spacers close to said second doped region to represent said first binary status, or to represent said second binary status by not injecting electrical charge into said second spacer.

3. The method of claim 2, further comprising:

programming a third bit by applying programming voltages to a third doped region of said plurality of doped regions and to said gate, applying a fourth doped region of said plurality of doped regions with programming current or ground potential, thereby injecting and storing electrical charge in a third spacer of said spacers close to said third doped region, or to represent said second binary status by not injecting electrical charge into said third spacer.

4. The method of claim 3, further comprising:

programming a fourth bit by applying programming voltages to said forth doped region of said plurality of doped regions and to said gate, applying said third doped region with programming current or ground potential, thereby injecting and storing electrical charge in a fourth spacer of said spacers close to said fourth doped region to present said first binary status, or to represent said second binary status by not injecting electrical charge into said fourth spacer.

5. A method of erasing a nonvolatile memory capable of storing multi-bits binary information bits, said memory cell having a first doped region and a second doped region with a channel and having a gate above said channel, a L-shape dielectric layer formed on side wall of said gate, spacers attached on said L-shape dielectric layer, said method comprising:

erasing a first bit of said multi-bits binary information bits by applying erasing voltages to said gate and a first doped region such that to cause charge representing a first binary status to be removed from a first spacer of said spacers for charge trapping.

6. A method of claim 5, further comprising:

erasing a second bit of said multi-bits binary information bits by applying erasing voltages to said gate and a second doped region such that to cause charge representing a second binary status to be removed from a second spacer of said spacers for charge trapping.

7. A method of reading an nonvolatile memory capable of storing multi-bits binary information bits, said memory cell having a first doped region and a second doped region with a channel and having a gate above said channel, an L-shape dielectric layer formed on side wall of said gate, spacers attached on said L-shape dielectric layer, said method comprising:

applying a reading bias on said gate and a second doped region, said reading bias having levels lower than the voltages applied during programming for sensing a channel current to determine whether the channel current is significantly representing a first binary status in said spacer adjacent to said first doped region or said channel current is relative low to said significant channel current representing a second binary status in said spacer adjacent to said first doped region.

8. A method of claim 7, further comprising:

applying said reading bias on said gate and a first doped region, said reading bias having levels lower than said voltages applied during programming for sensing said channel current to determine whether the channel current is significantly representing said first binary status in said spacer adjacent to said second doped region or said channel current is relative low to said significant channel current repressing said second binary status in said spacer adjacent to said second doped region.

9. A method of erasing a nonvolatile memory capable of storing multi-bits binary information bits, said memory cell having a first doped region and a second doped region and having a gate above a channel, a L-shape dielectric layer formed on side wall of said gate, spacers attached on said L-shape dielectric layer, said method comprising:

erasing the binary state by removing charge from said first spacer by exposing said nonvolatile memory in UV environment; and erasing the binary state by removing charge from said second spacer by exposing said nonvolatile memory in UV environment.

* * * * *